United States Patent [19]

Suzuki et al.

[11] 4,230,951
[45] Oct. 28, 1980

[54] WAVE SHAPING CIRCUIT

[75] Inventors: Yasoji Suzuki, Ayase; Susumu Kouyama, Kawasaki, both of Japan

[73] Assignee: Tokyo Shibaura Electric Co., Ltd., Japan

[21] Appl. No.: 882,147

[22] Filed: Feb. 28, 1978

[30] Foreign Application Priority Data

Feb. 28, 1977 [JP] Japan ................................. 52-21366

[51] Int. Cl.² .......................... H03K 1/10; H03K 5/08; H03K 17/16
[52] U.S. Cl. ............................. 307/200 B; 307/221 D; 307/237; 307/262; 328/162
[58] Field of Search ............... 307/200 B, 208, 221 C, 307/221 D, 237, 262, 269, 251, 241, 242; 328/162, 163, 171, 165, 167

[56] References Cited

U.S. PATENT DOCUMENTS

| | | | |
|---|---|---|---|
| 3,735,277 | 5/1973 | Wanlass | 307/262 X |
| 3,876,989 | 4/1975 | Bankowski | 307/221 D X |
| 3,927,334 | 12/1975 | Callahan | 307/269 |
| 3,950,654 | 4/1976 | Broedner et al. | 307/208 |
| 3,955,100 | 5/1976 | Takahashi et al. | 307/208 X |
| 3,961,269 | 6/1976 | Alvarez, Jr. | 307/262 X |
| 3,986,046 | 10/1976 | Wunner | 307/208 |
| 4,084,107 | 4/1978 | Ohba et al. | 307/221 D |
| 4,130,766 | 12/1978 | Patel et al. | 307/200 B X |

Primary Examiner—Larry N. Anagnos
Attorney, Agent, or Firm—Finnegan, Henderson, Farabow, Garrett & Dunner

[57] ABSTRACT

A plurality of signal lines receiving signals with different phases are connected to the reference potential point through switching elements. The switching elements connected to signal lines other than the signal line receiving an active signal are rendered conductive by the active signal on the signal line and the other signal lines are led to the reference potential.

11 Claims, 10 Drawing Figures

WAVE SHAPING CIRCUIT

BACKGROUND OF THE INVENTION

The present invention relates to a wave shaping circuit for wave shaping and amplifying a plurality of signals of different phases.

With recent use of large capacitive semiconductor memories charge coupled devices (CCD) have been increasingly used for memory devices. The CCD transfers electrical charges therein in response to application of clock signals with different phases to a plurality of CCD elements.

In the device, overlap capacitance formed among the electrodes receiving clock signals and electrode capacitance formed between electrodes and the reference potential point (ground), cause clock signals to interfere with one another, resulting in noise known as cross coupled voltage. The overlap capacitance and the electrode capacitance arise inherently from the structure of the CCD. Generally, in the case of large capacitive CCD, these capacitances are each approximately several hundreds pF so that the cross coupled voltage is necessarily produced.

When the cross coupled noise takes place in the clock pulses, undesirable active voltage is applied to electrodes other than the active electrode in the CCD operation. As a result, potential wells interfere with one another in charge transfer operation. More specifically, a high level signal is applied to the electrode of the CCD elements to be at low level so that the height of the barrier is lowered and thus charges stored in a potential well flow into adjacent potential wells. Thus, charges in those potential wells interfere each other in complex manner. This leads to reduction of the charge transfer efficiency and erroneous operation of the CCD.

In general, when active devices with capacitive structure included in the CCD are driven by multiphase clock signals, it is necessary to minimize the interference of the potential wells against the maximum cross coupled voltage produced in order to secure normal operation of such devices.

SUMMARY OF THE INVENTION

Accordingly, an object of the present invention is to provide a wave shaping circuit for preventing noise from entering multiphase pulses to drive active devices with capacitive structure.

According to the invention, there is provided a wave shaping circuit including signal lines to which multiphase pulses are applied. The signal lines are connected to the reference potential point through switching elements. The switching elements corresponding to the signal lines other than the signal line receiving an active signal are made conductive. These non-active signal lines are connected to ground via the corresponding switching elements.

Other objects and advantages of the invention will be apparent from the following description taken in connection with the accompanying drawings, in which:

DETAILED DESCRIPTION OF THE PREFERRED EMBODIMENTS

Figure 1:
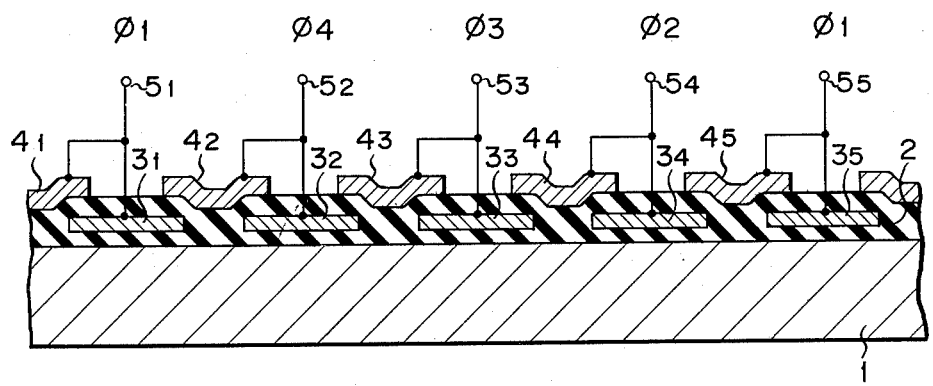
FIG. 1 shows a schematic view of a charge coupled device.

Referring now to FIG. 1, there is shown a schematic diagram illustrating a basic construction of a charge coupled device (CCD). As shown, the CCD is comprised of a semiconductor substrate 1, an insulating layer 2 formed on the substrate 1, a series of internal electrodes $3_1$ to $3_5$ separately disposed in the insulating layer 2, and a series of surface electrodes $4_1$ to $4_5$ which are layered on the surface of the insulating layer 2 and disposed between and above adjacent inner electrodes, as well illustrated in FIG. 1. The surface electrodes $4_1$ to $4_5$ and the inner electrodes $3_1$ to $3_5$ are respectively connected, and led to the corresponding external terminals $5_1$ to $5_5$, respectively. For example, the inner and surface electrodes $3_1$ and $4_1$ are connected to each other and led to the external terminal $5_1$. The inner and surface electrodes $3_2$ and $4_2$ are connected each other and led to the external terminal $5_2$. Remaining inner and surface electrodes and external terminals are connected in a similar fashion. The CCD device of this type is driven by successively applying multiphase clock pulses $\phi_1$ to $\phi_4$ shown in FIG. 2 to the external terminals $5_1$ to $5_5$.

Figure 3:
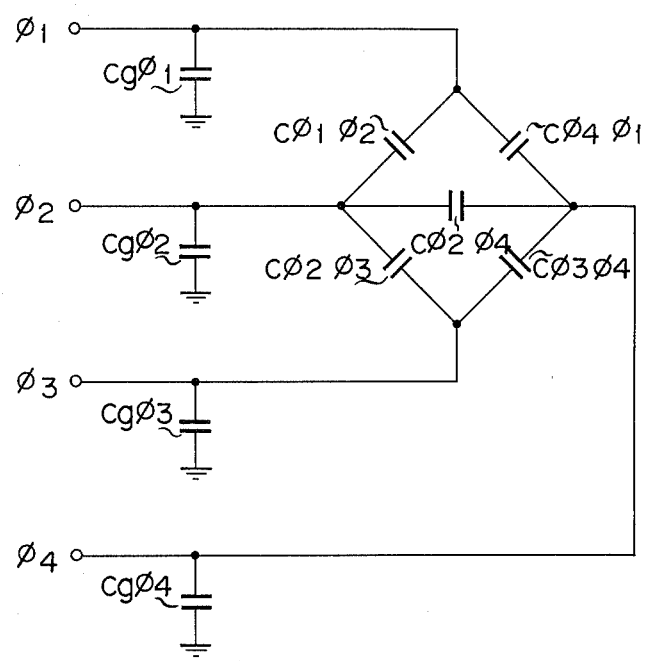
FIG. 3 shows an equivalent circuit of the CCD shown in FIG. 1.
Figure 4:
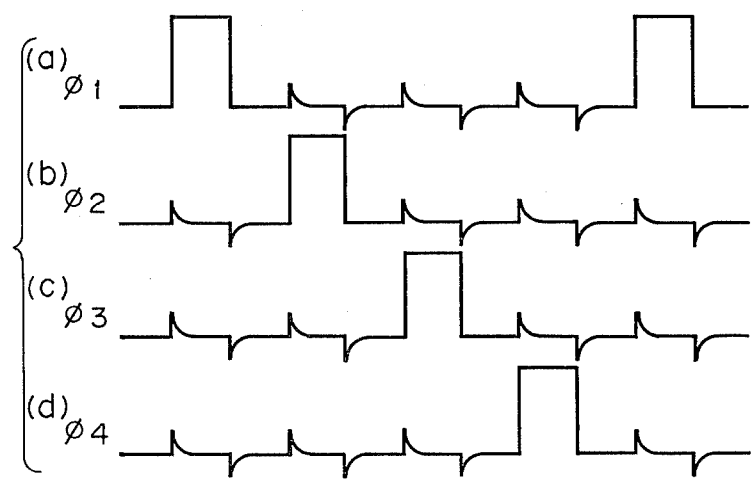
FIG. 4 shows a time chart of clock pulses including noise.

The equivalent circuit of the CCD device shown in FIG. 1 is as shown in FIG. 3. As shown, overlap capacitors $C\phi_1\phi_2$, $C\phi_2\phi_3$, $C\phi_3\phi_4$, $C\phi_4\phi_1$ and $C\phi_2\phi_4$ are each produced between the adjacent terminals, and electrode capacitors $Cg\phi_1$ to $Cg\phi_4$ are each produced between the terminals and ground. Clock pulses $\phi_1$ to $\phi_4$ interfere with one another through these capacitors to be clock pulses $\phi_1°$ to $\phi_4°$ including noise called cross coupled voltage, as shown in FIG. 4. When such clock pulses are used in driving the CCD, charges stored in the potential wells of it interfere with one another, as previously mentioned. It is for this reason that a wave shaping circuit as shown in FIG. 5 is used.

Figure 2:
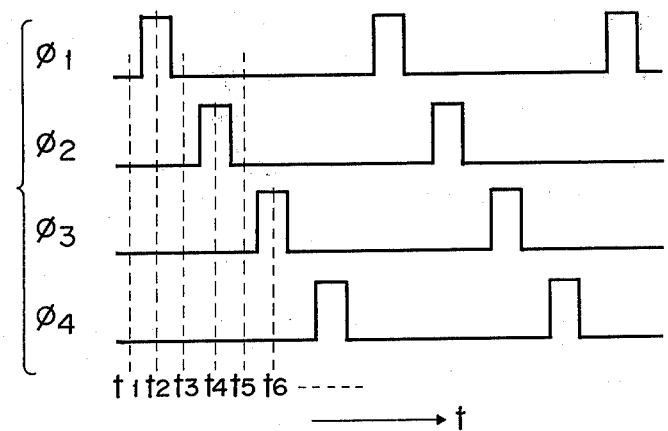
FIG. 2 shows a time chart illustrating multiphase clock pulses to be applied to the CCD of FIG. 1.
Figure 5:
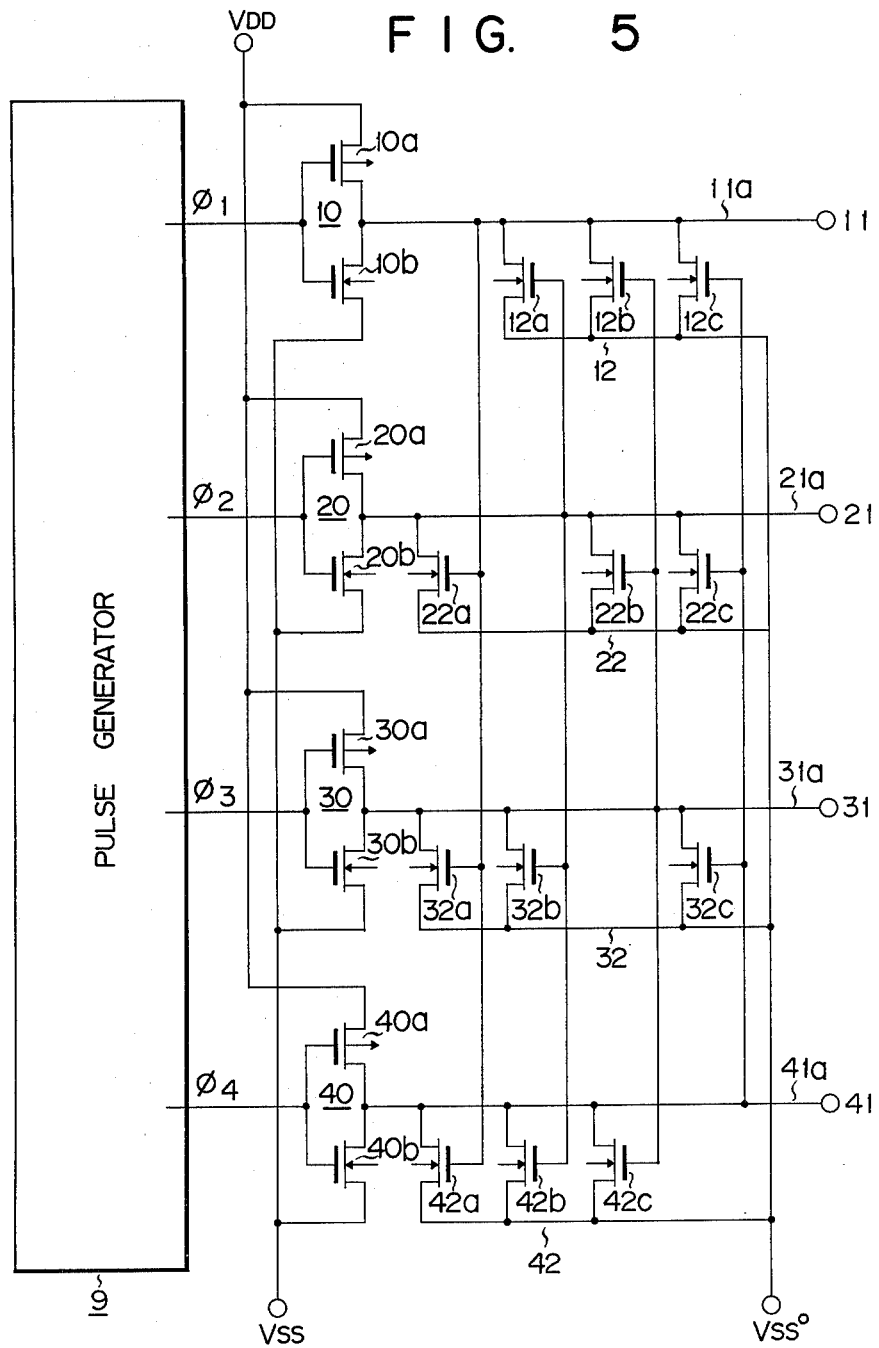
FIG. 5 shows a circuit diagram of a wave shaping circuit of an embodiment of the invention.

In FIG. 5, a pulse generator 9 generates four phase clock pulses $\phi_1$ to $\phi_4$ as shown in FIG. 2. These clock pulses $\phi_1$ to $\phi_4$ are applied to buffer circuits 10, 20, 30 and 40. Each of the buffer circuits includes a p-channel MOS FET and an n-channel MOS FET connected in series between a power source $V_{DD}$ and a power source $V_{SS}$. The MOS FETs in each buffer circuit are denoted by the same number as that of the corresponding buffer circuit and affixed by a and b. For example, the FETs of the buffer 10 are indicated by references 10a and 10b. The outputs of the buffer circuits 10 to 40 are connected to terminals 11, 21, 31 and 41 connected to the terminals $5_1$ to $5_4$ of the CCD, through signal lines 11a, 21a, 31a and 41a, respectively. The signal lines 11a, 21a, 31a and 41a are connected to a power source $V°_{SS}$, via switching circuits 12, 22, 32 and 42. Each of the switching circuits includes three n-channel MOS FETs, 12a to 12c, 22a to 22c, 32a to 32c and 42a to 42c. The gates of the respective MOS FETs 12a to 12c are connected to the signal lines 21a, 31a and 41a; the gates of the MOS FETs 22a to 22c are connected to the signal lines 11a, 31a and 41a; and the gates of the MOS FETs 32a to 32c are connected to the signal lines 11a, 21a and 31a.

In operation, clock pulses $\phi_1$ to $\phi_4$ are generated and applied to terminals $5_1$ to $5_4$, through signal lines 11a, 21a, 31a and 41a and terminals 11, 21, 31 and 41. The CCD operation changes the clock pulses $\phi_1$ to $\phi_4$ into noise including clock pulses $\phi_1°$ to $\phi_4°$. The clock pulse $\phi_1$ with active level, i.e. high level, is applied to the terminal 11 and then to the CCD, and at the same time to the gates of the MOS FETs 22a, 32a and 42a. Upon reception of the active level pulse, these FETs are conductive so that the lines 21a, 31a and 41a not receiving such high level pulse are led to the reference potential $V°_{SS}$. Accordingly, if the noise signal is applied to the signal lines 21a, 31a and 41a, it is absorbed by the MOS FETs 22, 32 and 42. As a result, the clock pulse $\phi_1$ only is applied to the CCD, through the corresponding input terminals $5_1$ and $5_5$ of the CCD. Similarly, the clock pulse $\phi_2$ with high level is applied to the signal line 21a so that the high level pulse is applied to the MOS FETs 12a, 32a and 42a of the switching circuits 12, 32 and 42 corresponding to the signal lines 11a, 31a and 41a and these FETs are conductive. The result is that these lines 11a, 31a and 41a are placed at the reference potential $V°_{SS}$ and the noise signals fed to them are absorbed by the MOS FETs 12a, 32a and 42a. In this manner, the potential of the signal lines other than that receiving the high level pulse is caused to be at the reference potential and only the desired pulse is led to the CCD. Consequently, the undesirable interference among the potential wells in the CCD is avoided, thus ensuring prevention of the erroneous operation of the CCD.

Figure 6:
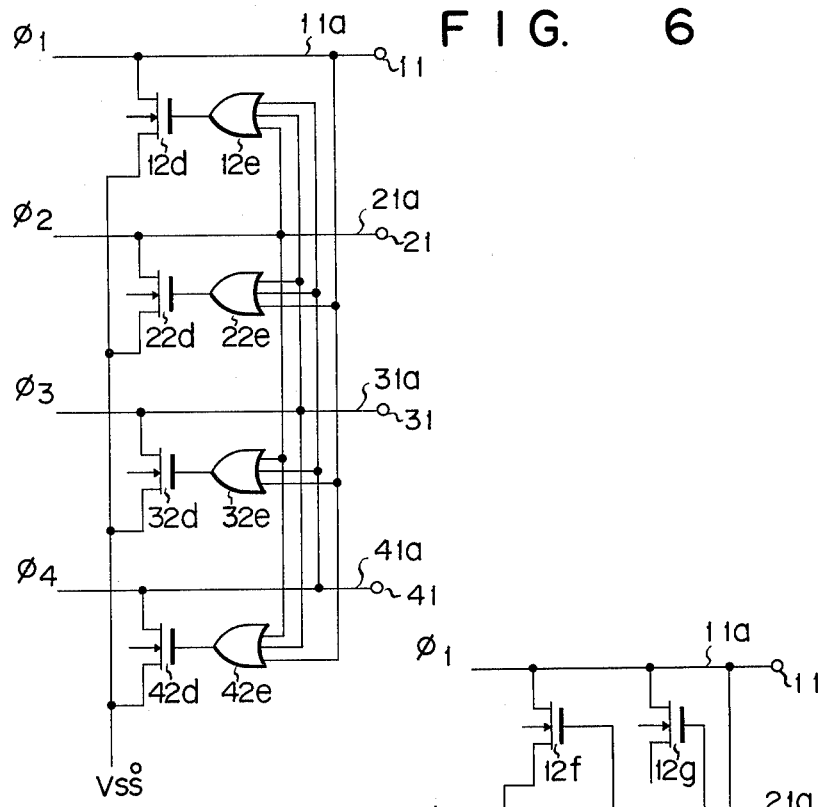
FIGS. 6 to 8 show circuit diagrams of other embodiments of the invention.

A modification of the switching circuit using three MOS FETs is shown in FIG. 6. Each switching circuit uses an MOS FET and an OR gate. For example, the switching circuit 12 uses an MOS FET 12d and an OR gate 12c. The signal lines 11a, 21a, 31a and 41a are connected to the reference potential $V°_{SS}$, through MOS FETs 12d, 22d, 32d and 42d. The gates of the MOS FETs are connected to the corresponding output of the OR gates, respectively, as shown in the figure. The OR gate 12e is connected at the inputs to the signal lines 21a, 31a and 41a; the OR gate 22e is connected at the inputs to the signal lines 11a, 31a and 41a; the OR gate 32e is connected at the inputs to the signal lines 11a, 21a and 41a; and the OR gate 42e is connected at the inputs to the signal lines 11a, 21a and 31a. In this example, when a high level pulse is applied to the line 11a, it goes to the gates of the MOS FETs 22d, 32d and 42d, through the OR gates 22e, 32e and 42e corresponding to the signal lines 21a, 31a and 41a. The result is that the MOS FETs 22d, 32d and 42d are conductive, the signal lines 21a, 31a and 41a are caused to be at the reference potential $V°_{SS}$, and the noise signal is absorbed by the MOS FETs 22d, 32d and 42d. This operation is correspondingly applied to the remaining switching circuits 22, 32 and 42.

Figure 7:
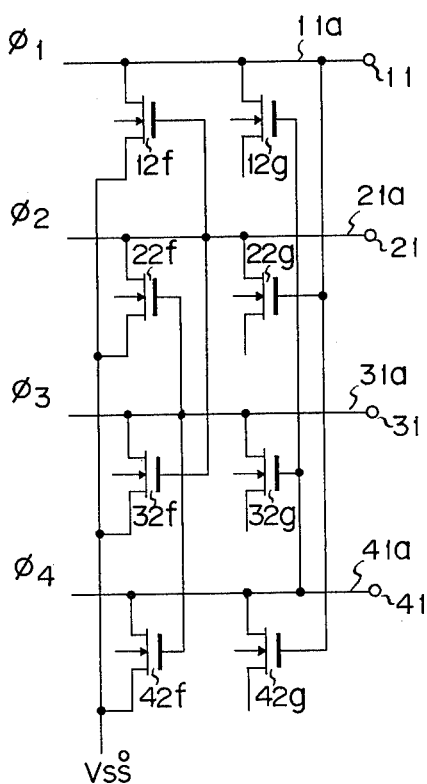

Another modification of the switching circuit is illustrated in FIG. 7. In this modification, only the signal lines adjacent to the signal line supplied with the high level pulse are placed at the reference potential, although, in the previous examples, the signal lines other than that receiving the high level signal are all led to the reference potential. As shown in FIG. 7, a signal line 21a is connected to the gates of the MOS FETs 12f and 32f included in the switching circuits 12 and 32 corresponding to the signal lines 11a and 31a adjacent to the line 21a, but not connected to the switching circuit corresponding to the line 41a disposed separately from the line 21a. Similarly, the signal line 31a is connected to the gates of the MOS FETs 22f and 42f but not connected to the switching circuit 12. The line 41a is connected to the gates of the MOS FETs 32g and 12g corresponding to the lines 31a and 11a adjacent to the line 41a. The terminal 11 is connected to the gates of the MOS FETs 22g and 42g of the switching circuits 22 and 42.

In operation, when a high level pulse is applied to the line 21a, the reference potential $V°_{SS}$ is introduced to the signal lines 11a and 31a, through the MOS FETs 12f and 32f. Accordingly, the noise signal entering the adjacent lines 11a and 31a is absorbed by the MOS FETs 12f and 32f. No reference potential $V°_{SS}$ is led to the signal line 41a so that the noise signal goes through the terminal 41 to the CCD element. Nevertheless, even if the CCD is driven by the noise signal, the CCD element driven by the desired pulse transfers normally charges, because the CCD elements at both sides are in inoperative condition. Accordingly, it operates in a correct mode.

Figure 8:
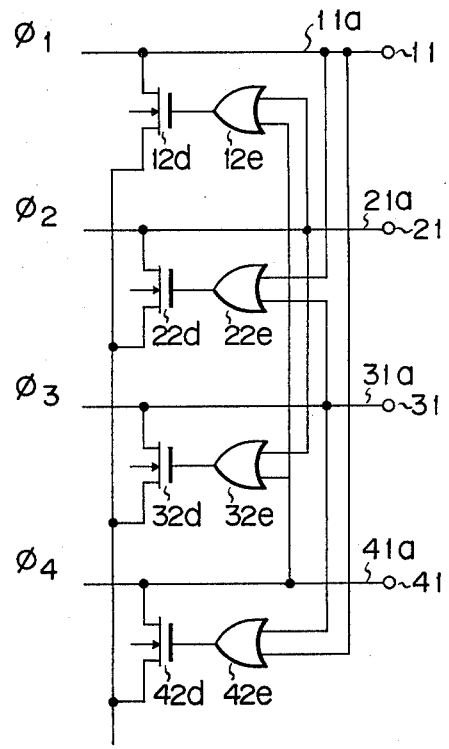

Another modification of the invention is illustrated in FIG. 8. This modification employs such as scheme that the noise signal is absorbed by only the switching circuits corresponding to the adjacent terminals, like the FIG. 7 example. The circuit of FIG. 8 uses switching circuits 12, 22, 32 and 42 similar in the circuit construction to those in FIG. 6. However, OR gates 12e, 22e, 32e and 42e in this example have each two input terminals connected to the input terminals of the adjacent OR gates. The operation of the FIG. 8 circuit is similar to that of the FIG. 7 circuit.

The FIGS. 7 and 8 circuits are advantageous over these of FIGS. 5 and 6 in that wiring and/or elements are saved.

Figure 9:
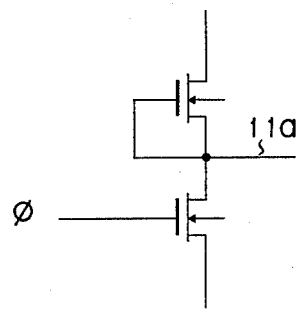
FIGS. 9 and 10 show circuit diagrams of modifications of a buffer circuit used in a pulse generator.
Figure 10:
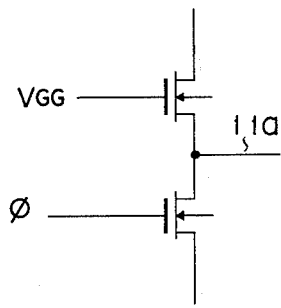

Having described the invention by using the CCD device, the invention is also applicable to the MOS circuits driven by the multiphase clock pulses, the circuit to drive active devices of capacitive construction such as bucket-brigade devices, and the like. Additionally, the wave shaping circuit of the invention may use any type of multiphase pulses, with corresponding number of switching circuits. The n-channel MOS FETs used in the switching circuits are replaceable by p-channel MOS FETs. The complementary MOS FET circuit in the buffer circuit may be substituted by the same polarity MOS FETs as shown in FIGS. 9 and 10. In the buffer circuit in FIG. 9, two MOS FETs are connected in series and the gate of one of them receives a clock pulse while the other is connected to the connection point of both the FETs and to the terminal, for example, 11. In the example of FIG. 10, one of the gates of the series connected MOS FETs receives a clock pulse $\phi$ while the other is connected to a power source $V_{GG}$. The node of both the FETs is coupled with the terminal 11, for example.

What we claim is:

1. A wave shaping circuit comprising:
   a plurality of signal lines connected to receive a plurality of clock signals having different phases and apply the clock signals to a capacitive active device, each of said clock signals having an active level to activate the capacitive active device and a non-active level;
   a plurality of switching circuits connected between a reference potential point and said signal lines, each of said switching circuits having a control signal input means connected to at least one of said signal lines adjacent to that one of the signal lines to which said each of said switching circuits is connected, wherein a switching circuit connected through the control signal input means to a signal line receiving an active level clock signal is rendered conductive and drives said adjacent signal line to the reference potential point.

2. A wave shaping circuit comprising:
a plurality of signal lines connected to receive a plurality of clock signals having different phases and apply the clock signals to a capacitive active device, each of said clock signals having non-overlapping active levels to activate the capacitive active device and a non-active level;
a plurality of switching circuits connected between a reference potential point and said signal lines, each of said switching circuits having a control signal input means connected to the signal lines adjacent to that one of the signal lines to which said each of said switching circuits is connected, wherein the switching circuits connected through the control signal input means to one of said signal lines supplied with an active level of said clock signal are rendered conductive and drive the signal lines not receiving an active level clock signal to the reference point.

3. A wave shaping circuit according to claim 2, in which said switching circuits are each comprised of a plurality of MOS FETs connected in parallel between said corresponding signal lines and the reference potential point, and said MOS FETs are provided with gates connected with at least said adjacent signal lines.

4. A wave shaping circuit according to claim 2, in which said switching circuits are each comprised of an MOS FET connected between said corresponding signal lines and the reference potential point, and an OR gate having a plurality of input terminals connected to at least said adjacent signal lines and an output terminal connected to the gate of said MOS FET.

5. A wave shaping circuit according to claim 2, in which said capacitive active device is a charge coupled device.

6. A wave shaping circuit according to claim 2, in which said capacitive active device is a bucket-brigade device.

7. A wave shaping circuit comprising: a plurality of signal lines connected to receive a plurality of clock signals having different phases and apply the signals to a capacitive active device; each of said clock signals having non-overlapping active levels to activate the capacitive active device and a non-active level; and a plurality of switching circuits connected between a reference potential point and said signal lines and having control signal input means to receive switching control signals; wherein each of said signal lines is connected to said control signal input means of said switching circuits corresponding to other signal lines, and when said clock signal with active level is transmitted to at least one of said signal lines, the active level of the clock signal is applied to the control signal input means of said switching circuits corresponding to said other signal lines to render said switching circuit conductive and drive said remaining signal lines to the reference potential.

8. A wave shaping circuit according to claim 7, in which said switching circuits are each comprised of a plurality of MOS FETs connected in parallel between said corresponding signal lines and the reference potential point and said MOS FETs are provided with gates connected to other signal lines than said corresponding signal line.

9. A wave shaping circuit according to claim 7, in which said switching circuits are each comprised of an MOS FET connected between said corresponding signal line and the reference potential point and an OR gate having an output terminal connected to the gate of said MOS FET and a plurality of input terminals connected to said other signal lines than said corresponding signal line.

10. A wave shaping circuit according to claim 7, in which said capacitive active device is a charge coupled device.

11. A wave shaping circuit according to claim 7, in which said capacitive active element device is a bucket-brigade device.

* * * * *